United States Patent [19]
Barnett et al.

[11] Patent Number: 6,061,243
[45] Date of Patent: May 9, 2000

[54] MODULAR AND MULTIFUNCTIONAL STRUCTURE

[75] Inventors: David M. Barnett; Suraj P. Rawal; Daniel R. Morgenthaler, all of Littleton; Edward N. Harris, Denver, all of Colo.

[73] Assignee: Lockheed Martin Corporation, Besthesda, Md.

[21] Appl. No.: 09/331,922

[22] PCT Filed: Nov. 6, 1998

[86] PCT No.: PCT/US98/23840

§ 371 Date: Jun. 29, 1999

§ 102(e) Date: Jun. 29, 1999

[87] PCT Pub. No.: WO99/25165

PCT Pub. Date: May 20, 1999

Related U.S. Application Data

[60] Provisional application No. 60/064,410, Nov. 6, 1997.

[51] Int. Cl.[7] ................................................ H05K 7/20
[52] U.S. Cl. .................... 361/704; 361/707; 361/709; 361/713; 361/715; 361/717; 361/722; 361/728; 361/761; 361/748; 361/792; 361/785; 257/704; 257/706; 257/712; 257/723; 257/707; 257/675; 165/80.3; 165/104.33; 165/185; 439/34; 439/65

[58] Field of Search .................... 361/688–690, 361/702–704, 707, 709, 710, 712–715, 719, 761, 760, 767, 772, 749; 257/706, 707, 675; 165/80.3, 104.33, 185; 439/65, 67, 74, 77

[56] References Cited

U.S. PATENT DOCUMENTS

| | | | |
|---|---|---|---|
| 4,730,232 | 3/1988 | Lindberg | 361/381 |
| 5,102,831 | 4/1992 | Haga | 437/220 |
| 5,159,751 | 11/1992 | Cottingham et al. | 29/832 |
| 5,208,729 | 5/1993 | Cipolla et al. | 361/382 |
| 5,373,627 | 12/1994 | Grebe | 29/841 |
| 5,384,691 | 1/1995 | Neugebaure et al. | 361/794 |
| 5,412,539 | 5/1995 | Elwell et al. | 361/792 |
| 5,646,828 | 7/1997 | Degani et al. | 361/715 |
| 5,661,339 | 8/1997 | Clayton | 257/678 |

*Primary Examiner*—Gerald Tolin
*Assistant Examiner*—Boris L. Chervinsky
*Attorney, Agent, or Firm*—Holme Roberts & Owen LLP

[57] ABSTRACT

The present invention is directed to a multifunction structure (MFS) in which electrical/electronic componentry, thermal control and structural support are integrated into a monolithic structure that is particularly useful in spacecraft applications. The multifunctional structure is also designed to be modular so that the electrical/electronic componentry can be repaired or replaced.

24 Claims, 8 Drawing Sheets

MODULAR AND MULTIFUNCTIONAL STRUCTURE

This application claims benefit of provisional application 60/064,410 Nov. 6, 1997. This application is a 371 of PCT/US98/23840 Nov. 6, 1998.

FIELD OF THE INVENTION

The present invention relates to the integration of electrical/electronic related componentry with related thermal control and structural support systems into a unitary structure that is suitable for use in spacecraft and the like.

BACKGROUND OF THE INVENTION

Presently, the electrical/electronic systems and the thermal control and structural support for the electrical/electronic systems of a spacecraft are designed and fabricated separately and then connected to one another during the final assembly of the spacecraft. Typical structural support elements for the electrical/electronic systems include load-bearing plates, frames, shells and walls. Thermal control for electrical/electronic systems is generally achieved using radiators, cold plates and the like. The electrical/electronic systems are implemented in the form of "black boxes". Each black box contains a plurality of circuit boards that are each connected to a mother board. The mother board provides power to each of the circuit boards and communication paths that permit signals to be transmitted between the circuit boards. The mother board also provides power and communication interfaces to the environment exterior to the black box. The transmission of power and signals to the black boxes is achieved with relatively bulky cables that mate with the appropriate mother board interfaces.

The process of separately designing and fabricating the electrical/electronic systems and the related structural support and thermal control systems of a spacecraft and then connecting each of these systems to one another during final assembly results in a spacecraft in which a substantial portion of the available volume within the spacecraft is occupied by these systems. As such, the room available in the spacecraft for other systems is constrained by these systems. Stated differently, the ratio of electrical/electronic functionality to the volume occupied by the electrical/electronic systems and the associated structural support and thermal control systems is relatively low. Furthermore, the present process has resulted in a spacecraft in which a relatively large percentage of the overall mass of the spacecraft is attributable to the electrical/electronic systems and the related structural and thermal control systems.

SUMMARY OF THE INVENTION

The present invention is directed to providing a structure that integrates the electrical/electronic systems and associated structural and thermal control systems in a manner that realizes a substantial increase in the ratio of electrical/electronic functionality to the volume occupied by the electrical/electronic systems and related structural and thermal systems. Due to the increase in this ratio, for a given electrical/electronic functionality, there is more space available within a spacecraft for other equipment when compared to a spacecraft that employs the "black box" approach. In one case, a 50% increase in the internal volume was realized. Further, the structure is also capable of providing a reduction in mass for a given electrical/electronic functionality. This reduction in mass permits, for example, a more massive payload to be carried aloft by the spacecraft. In one instance, a 25% increase in payload mass fraction was realized.

The structure of the present invention, due to the integration of several systems is referred to as a multifunctional structure or MFS. One embodiment of the multifunctional structure includes a panel, a flex circuit patch, a multi-chip module and a connector for establishing an electrical pathway between the multi-chip module and the flex circuit patch. The panel serves as a structural support or mounting structure for the other components of the MFS. Additionally, the panel serves to dissipate the heat generated by the multi-chip module and the flex circuit patch. This, in turn, prevents the multi-chip module from being damaged or malfunctioning due to overheating. The multi-chip module is comprised of a substrate on which two or more semiconductor dies have been integrated. A die is the electronic circuitry that is located in, for example, the dual-in-line packages that one sees on a printed circuit board. By integrating two or more dies onto a single substrate, a substantial increase in the electronic functionality per unit area is realized. Stated differently, a multi-chip module with two dies disposed on a substrate occupies considerably less surface area than if the same dies were placed in a package and then attached to a printed circuit board. Also part of the multi-chip module is an electrical conductor or trace that is located, at least part, on the substrate and is used to establish an electrical connection between at least one of the dies and the flex circuit patch. In most applications, there are likely to be many such traces or leads, as well as traces that connect the dies on the multi-chip module to one another. The flex circuit patch is a thin, flexible structure with one or more traces that facilitate the transmission of electrical signals between the multi-chip module and either other multi-chip modules located on the panel or electrical circuitry located off of the panel. The connector is used to establish an electrical connection between the trace or traces associated with the multi-chip module and the trace or traces associated with the flex circuit patch.

The MFS described above is a relatively thin structure that, due to several of the features noted above, has a high ratio of electronic functionality to the volume occupied by the electrical/electronic system and related structural and thermal control systems. This high ratio is realized, at least in part, by employing a panel that serves as a structural support for the other systems and also contributes to the thermal control function. The use of a multi-chip module increases electronic functionality per unit area relative to the printed circuit boards used in "black boxes". In many cases, the multi-chip modules also have a lower height profile relative to printed circuit boards that have packaged chips located on one or both sides of the board. As such, the multi-chip modules increases electronic functionality per unit volume relative to the printed circuit board technology. Further, the use of the thin, flex circuit patches substantially reduces or eliminates the need for bulky cables.

Also characteristic of the MES is a substantial mass reduction relative to the "black box" approach. This mass reduction is attributable, at least in part, to the use of the flex circuit patch, which is considerably less massive than the bulky cables presently in use. Also contributing to the mass reduction is the panel. In one embodiment, the panel is a composite structure with a honeycomb core disposed between a pair of face plates. This panel structure has a relatively low mass while also providing a rigid substrate on which the other components of the MFS can be mounted. Also contributing to the reduction in mass is the use of the multi-chip module, which avoids the use of a considerable portion of the infrastructure used to support packaged chips on printed circuit boards.

If there are other multi-chip modules on the panel or it is necessary to establish an electrical connection to electrical componentry that is located off of the panel, the MFS also includes a flex circuit jumper that is comprised of a flexible substrate on which one or more electrically conductive traces are established. An electrical connection is established between a trace associated with the flex circuit jumper and a trace associated with the flex circuit patch using an anisotropic, electrically conductive adhesive material that only conducts electricity in the direction perpendicular to the planes of the traces. To elaborate, if the traces are considered to be in parallel x-y planes, then the adhesive material performs so as to only conduct electricity in the z-direction, i.e., between the traces. This provides electrical isolation in the x-y plane, which makes it less likely that the signal that is to be conveyed between particular traces on the flex circuit patch and the flex circuit jumper is conveyed to an adjacent trace on the flex circuit patch or the flex circuit jumper. An alternative electrical connection method uses a reflow solder process.

Another embodiment of the MFS provides the ability to readily remove and replace components of the MFS. To demount the multi-chip module requires breaking the connections between: (1) the multi-chip module and the flex circuit patch; and (2) the multi-chip module and the panel. To facilitate the severing of the first connection without having cut the traces of the multi-chip module, the connector is in the form of a socket or plug-like structure that allows the multi-chip module traces to be disengaged from the plug with little, if any, damage to the traces. With respect to the severing of the second connection, the connection between the multi-chip module and the panel is established with an adhesive or bonding agent whose bond can be weakened upon the application of a suitable attenuating agent, such as heat or a solvent. Consequently, this connection is broken by applying the appropriate attenuating agent to the bond and, provided the first connection has been previously broken, removing the multi-chip module.

To facilitate the removal of the flex circuit patch from the panel, the multi-chip module must first be detached from the panel and then the patch. The multi-chip module is detached from the panel as previously described. With respect to the detachment of the patch, the bond between the patch and the panel is established with an adhesive that is susceptible to weakening upon the application of an attenuating agent, such as heat or a solvent. Consequently, Upon the application of the appropriate attentuating agent, the flex circuit patch can be "peeled" off of the panel. Preferably, the attenuating agent is different than the attenuating agent used to break the bond between the multi-chip module and the panel so that the multi-chip module can be removed without affecting the bond between the patch and the panel.

In situations where the MFS employs flex circuit jumpers to establish connections between two flex circuit patches, the removal of one of the flex circuit patches requires that the connection between the patch and the flex circuit jumper be severed. As previously noted, the electrical connection between a trace of the flex circuit patch and a trace on the flex circuit jumper is established using a "z-direction" adhesive. The bond created by this adhesive cannot readily be weakened with chemical or thermal agents. Consequently, to sever the connection, the bonded area must be excised from both the flex circuit patch and the flex circuit jumper. The subsequent reattachment of the flex circuit jumper to a new flex circuit patch requires that the traces of flex circuit patch be re-bonded to the traces of the flex circuit jumper. To facilitate both the initial and one or more subsequent bondings of the traces of the flex circuit patch to the traces of the flex circuit jumper, the flex circuit jumper has two or more bonding pads that aid in aligning the traces on the patch the corresponding traces on the jumper. To elaborate with respect to the connection of a single trace on the flex circuit patch to a single trace on the flex circuit jumper, the trace on the flex circuit jumper has a first pad near the end of the trace and a second pad located further from the end of the trace. Associated with each pad is a hole that, when the traces on the flex circuit patch and the traces on the flex circuit jumper are properly aligned, lines up with a hole on the flex circuit patch. The initial bonding of the traces is established by aligning the hole on the flex circuit patch with the hole associated with the first pad on the flex circuit jumper. Once aligned, the bonding of the two traces is established in the area defined by the pad. Subsequently, to permit the flex circuit patch to be removed, the bonded area is cut away. To re-establish the electrical connection between the traces of a new flex circuit patch and the flex circuit jumper, the holes associated with the second pad are aligned with holes on the new flex circuit patch. Once aligned, the bond is established in the area defined or outlined by the second pad. While holes are used for alignment, other alignment techniques, like edge markings, can also be used. This process for disconnecting and reconnecting a flex circuit jumper is also applicable when the flex circuit jumper establishes an electrical connection electrical componentry other than another multi-chip module.

DETAILED DESCRIPTION

Figure 1:
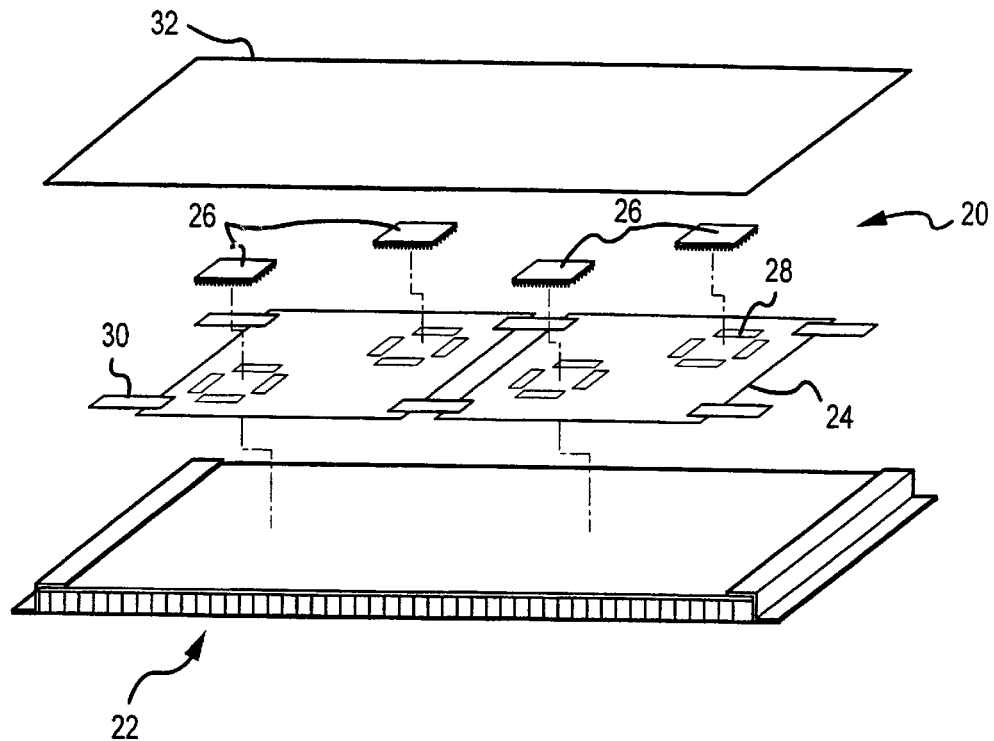
FIG. 1 is an exploded, perspective view of a multifunctional structure.
Figure 2:
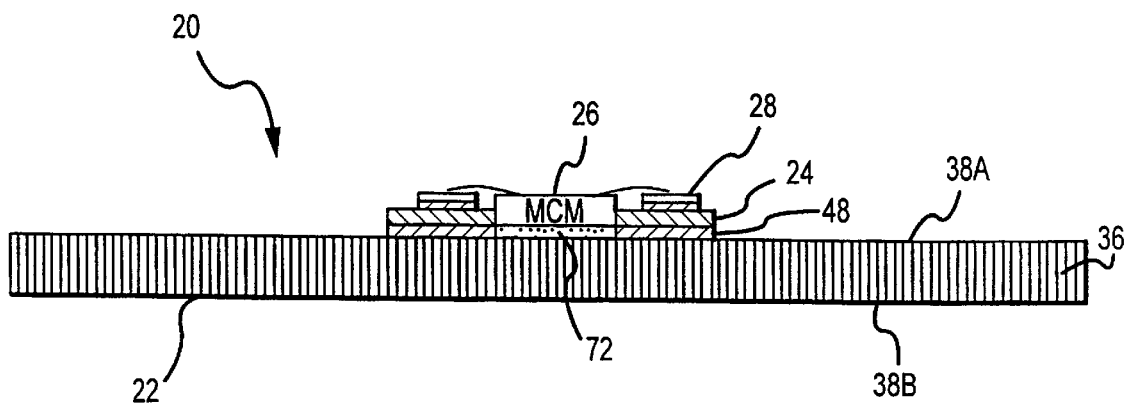
FIG. 2 is a cross section of a multifunctional structure.

With reference to FIGS. 1 and 2, a multifunctional structure 20 (hereinafter referred to as MFS 20), is illustrated that integrates electrical/electronic systems with the related thermal control and structural support systems to realize: (1) an improved ratio of electronic functionality to volume occupied by the electrical/electronic systems and the associated structural and thermal control systems; and (2) a reduced mass.

Generally, the MFS 20 is comprised of a panel 22, one or more flex circuit patch 24, one or more multi-chip module 26 (hereinafter MCM 26), one or more connector 28, one or more flex circuit jumper 30 and a cover 32. The panel 22 serves: (1) to provide structural support for other elements of the MFS 20; and (2) to transfer heat generated by the electrical/electronic components of the MFS 20 away from these components so as to prevent overheating of these components, which can cause these components to malfunction and/or be irreparably damaged. Each of the flex circuit patch 24 are attached to one side of the panel 22 and primarily serve to provide electrically conductive pathways between the electrical/electronic elements associated with the patch and electrical/electronic elements located off the patch, such as on another patch attached to the panel or electrical/electronic componentry associated with a different panel. The MCM 26 is comprised of a substrate on which are located several dies, i.e., the substrates and associated microelectronics found within, for example, the dual-in-line packages that one sees on a printed circuit board. Generally, the microelectronics associated with each of the dies has been designed to perform a particular function, such as pulse code modulation. Typically, the MCM 26 includes a number of dies that cooperate with one another to perform a more general function, such as command and data handling in an overall system or computer architecture. Also associated with the substrate of the MCM 26 are traces, i.e., electrically conductive lines, that are used to establish electrical connections with other electrical elements via the flex circuit patch 24. The connector 28 serves to establish the electrical connections between the traces associated with the MCM 26 and the traces associated with the flex circuit patch 24. Similarly, the flex circuit jumper 30 serves to establish electrical connections between a flex circuit patch and other electrical elements exterior to the patch, such as another patch located on the same panel, another patch located on a different panel, and connectors that interface the flex circuit jumper 30 to a plug or similar structure that has different format, such as a conventional cable. The cover 32 serves to protect the underlying electrical/electronic componentry from physical contact and/or shield the electrical/electronic componentry from electromagnetic interference and/or ionizing radiation that can adversely affect the performance of the electrical/electronic componentry.

Figure 3:
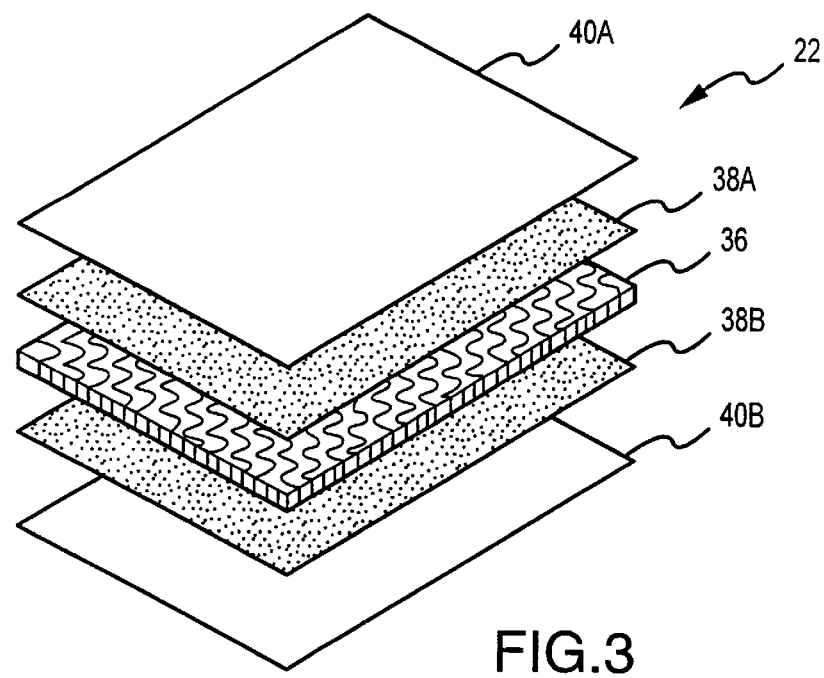
FIG. 3 is an exploded, perspective view of the elements of the panel portion of a multifunctional structure.

The panel 22, as previously noted, provides a relatively rigid structure for supporting other elements of the MFS 20 and also conducts heat away from the electrical/electronic componentry that is generating the heat so as to prevent the componentry that is generating the heat, as well as other electrical/electronic componentry on the panel from being damaged or malfunctioning due to over heating. It is also desirable that the panel have a relatively low mass. With reference to FIG. 3, an example of the panel 22 is discussed that provides a rigid support structure for other elements of the MFS 20, is thermally conductive to dissipate heat generated by the electrical/electronic componentry of the MFS 20 and has a low mass. The panel 22 includes a honeycomb core 36 that provides a high degree of rigidity with a relatively low mass. It should be appreciated that the term "honeycomb" is not limited to core structures that have a hexagonal shape but includes structures that are generally characterized as corrugated. In one embodiment, a 5052 aluminum honeycomb core material is utilized. An alternative to a honeycomb core is a foam based core. The honeycomb core 36 is disposed between facesheet laminates 38A, 38B. Preferably, the facesheet laminates 38A, 38B are quasi-isotropic laminates that disperse heat laterally. In one embodiment, a graphite/polycyanate (GR-PC) facesheet laminate is used. The honeycomb core 36 and the facesheet laminates 38A, 38B are, in turn, located between aluminum foil sheets 40A, 40B. Bonding of the honeycomb core 36, facesheet laminates 38A, 38B and aluminum foil sheets 40A, 40B is accomplished using an autoclave-cocure process. Also part of the panel assembly is a edge filler 42 that has high thermal conductivity. To elaborate, the edge filler 42 is a material that is injected into the honeycomb cells at the edge of the panel 22 and, upon curing, forms a high thermal conductivity link between the facesheet laminates 38A, 38B. It should be appreciated other panel strauctures, such as solid and laminated, are possible. Further, the panel is not restricted to being flat. As such, curved panels are possible.

Figure 4A:
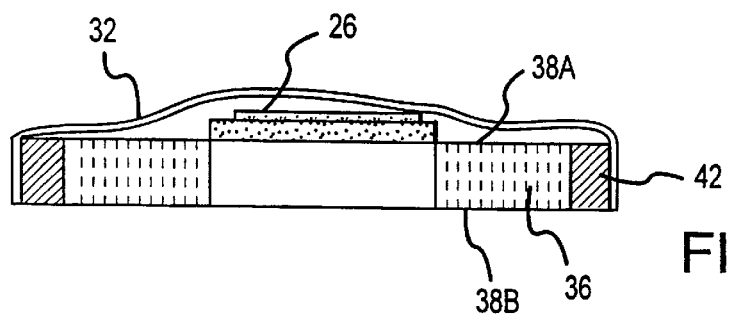
FIGS. 4A–4C illustrates different panel structure for transferrring heat away from the electrical/electronic portion of a multifunctional structure.
Figure 4B:
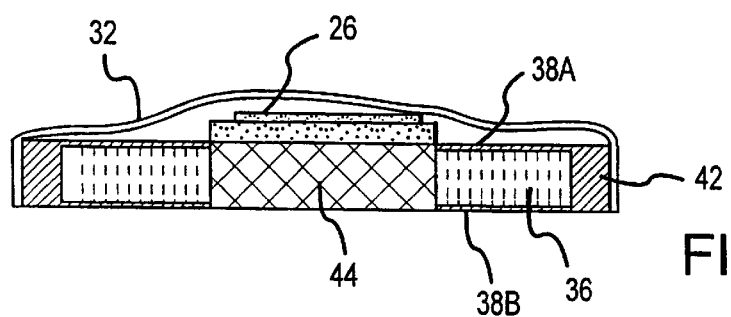
Figure 4C:
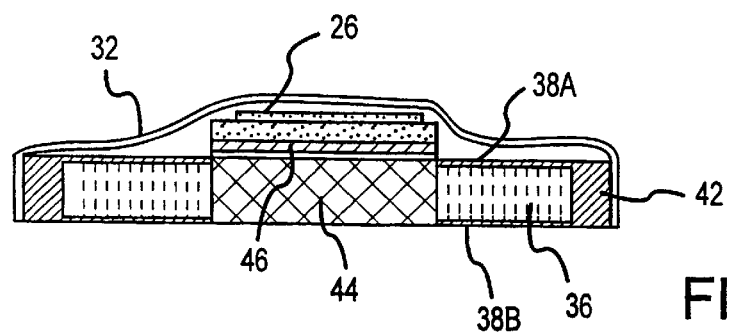

With reference to FIG. 4A, the thermal control aspect of the panel 22 is discussed. In this embodiment, heat generated by the MCM 26 is laterally dispersed by the facesheet laminate 38A. This heat is then conveyed by both the honeycomb core 36 and the edge filler 42 to the facesheet laminate 38B for radiation to the exterior environment. FIG. 4B illustrates a panel that has an enhanced thermal control capability. Specifically, there is a high thermal conductivity filler 44 established in the honeycomb cells underlying the MCM 26. Further, thicker facesheet laminates 38A, 38B relative to the laminates shown in FIG. 4A are used. The thicker laminates provide a lower thermal resistance. In this case, heat generated by the MCM 26 is laterally dispersed by the facesheet laminate 38A and transported to the facesheet laminate 38B by, collectively, the honeycomb core 36, the edge filler 42, and the high conductivity filler 44. FIG. 4C illustrates a further thermal control enhancement relative to the thermal enhancements illustrated with respect to FIG. 4B. Specifically, an isotropic carbon-carbon thermal doubler 46 is disposed between the MCM 26 and the facesheet laminate 38A. The doubler 46 serves to further enhance the transfer of heat from the MCM 26 to, primarily, the high conductivity filler 44 for conveyance to the facesheet laminate 38B and radiation into the exterior environment.

Figure 5:
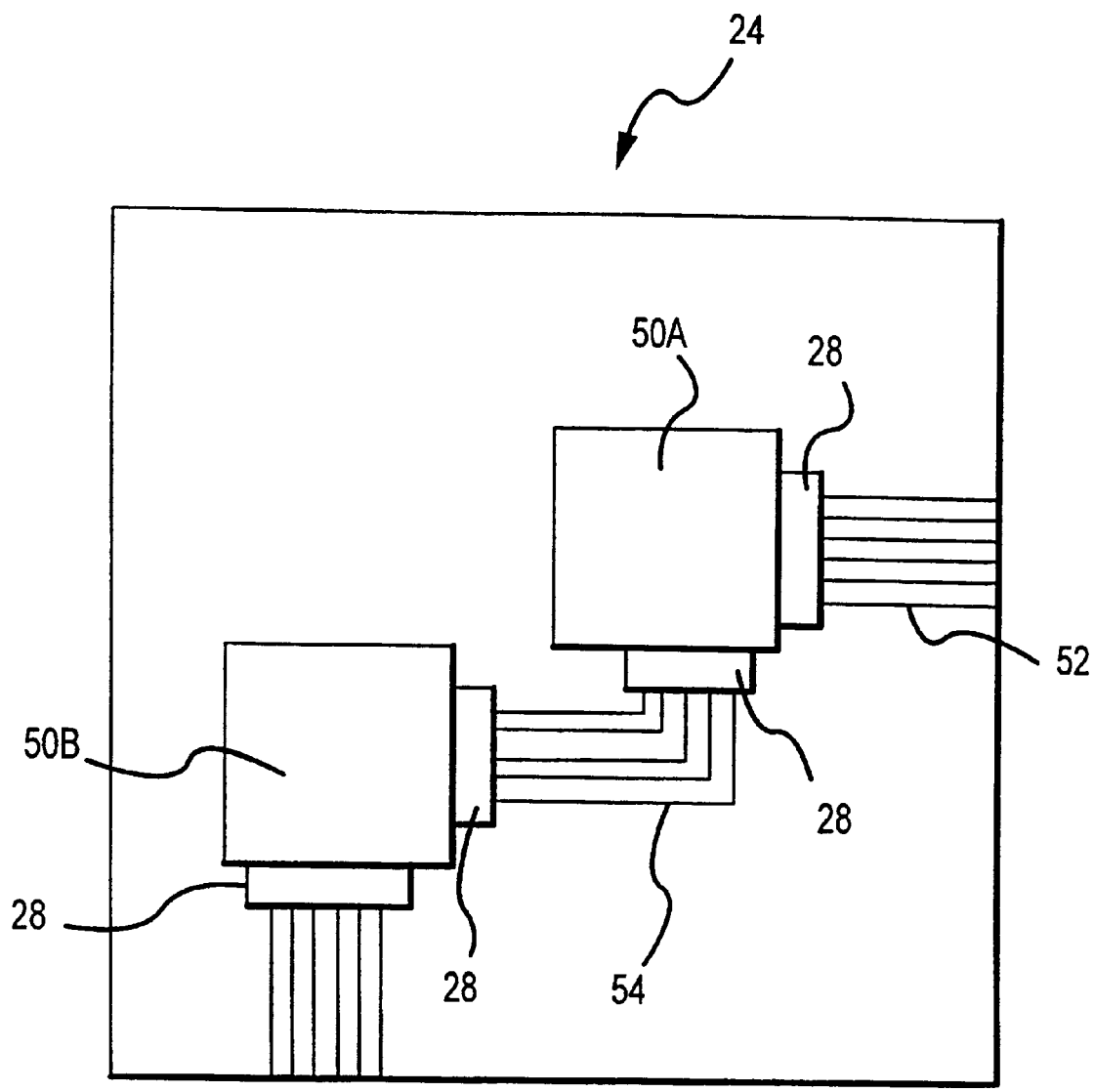
FIG. 5 illustrates a flex circuit patch that accommodates two multi-chip modules.

With reference to FIG. 5, an example of a flex circuit patch 24 is illustrated. The particular flex circuit patch 24 includes first and second holes 50A, 50B for accommodating multi-chip modules. Traces 52 are used to convey signals between a multi-chip module and electrical/electronic componentry exterior to the flex circuit patch 24. This can be electrical/electronic componentry associated with another patch 24 on the same panel or componentry located on an entirely separate panel. Traces 54 facilitate electrical communication between the multi-chip module disposed in first hole 50A and the multi-chip module disposed in the second hole 50B. Traces that interface with electrical/electronic componentry that are mounted on the surface of the flex circuit patch 24 are also feasible. The flex circuit patch 24 is preferably a two-layer copper/polyimide (Cu/PI) material that does not use an adhesive bond between the copper and the polyimide layers, i.e., an adhesiveless, copper-polyimide material. As such, the flex circuit patch is very thin and very flexible. Further, this material is more suitable for conducting high frequency signals than the flex circuit materials that employ adhesives. If needed, several layers of the two-layer copper/polyimide material can be stacked on top of one another and bonded together with connections established between the traces associated with each layer using via holes. To establish electrical connections between the multi-chip modules located in the first and second holes 50A, 50B and the traces 52, 53 a plurality of connector 28 are disposed on the flex circuit patch 24.

The attachment of the flex circuit patch 24 to the panel 22 is accomplished with an adhesive 48 that is thermally conductive, capable of absorbing shock and creates a bond that can subsequently be broken to permit removal of the patch when repair or reworking of the MFS is required. A number of adhesives are available that satisfy these requirements. The weakening of the bond between the patch 24 and the panel 20 that is established by the adhesive 48 is accomplished, for all presently known adhesives that are suitable for use in the MFS 20, by applying heat or solvent to the bond.

Figure 6:
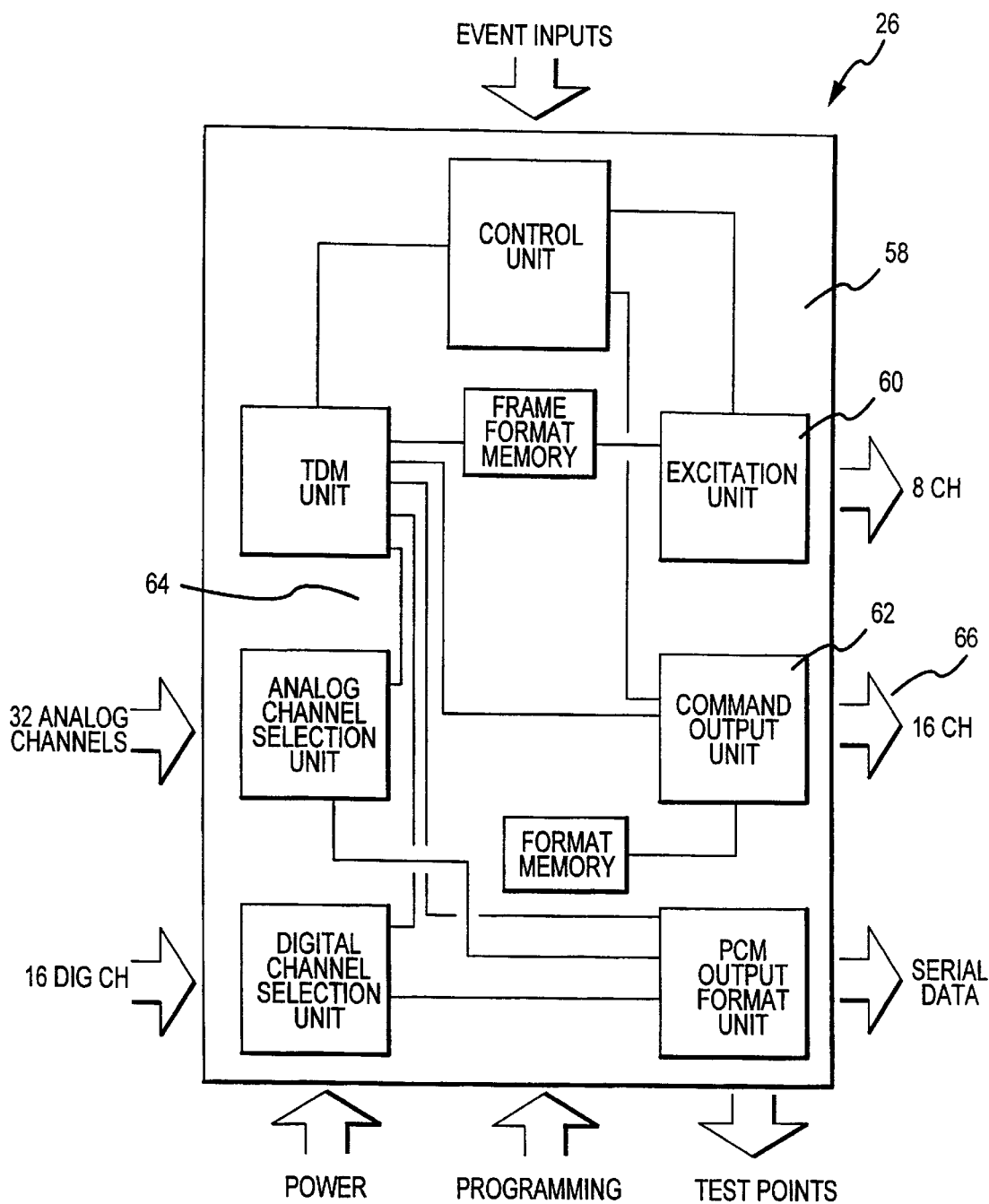
FIG. 6 is a schematic diagram of a command and data handling multi-chip module.

FIG. 6 is a schematic of an example of an MCM 26. The MCM 26 includes a substrate 58 on which are disposed two or more dies that each perform a particular function. Examples of dies that perform particular functions are excitation unit 60 and command output unit 62. Further, the MCM 26 is generally designed such that all of the dies on the MCM cooperate with one another to accomplish a more general function. In the case of the example of an MCM 26 illustrated in FIG. 6, the plurality of dies residing on the substrate 58 cooperate with one another to perform a command and data handling function when in operation. Traces are also established on the substrate 58 to enable communications between the various dies located on the substrate 58. In FIG. 6, traces 64 are an example of these traces. A further set of traces facilitate communication between the MCM 26 and the flex circuit patch 24. An example of these traces are the sixteen channel traces 66 that interface with the command output unit 62 in FIG. 6. These traces extend from the die and continue over the substrate 58 and extend beyond edge of the substrate 58. The portions of the traces that extend beyond the die 58 engage the connectors 28 to establish the connection between the MCM 26 and the flex circuit patch 24. As previously noted, the flex patch 24 provides traces that can facilitate communications with MCMs located on other patches that are disposed on the panel or with other circuitry that is located on an entirely separate panel.

Figure 7:
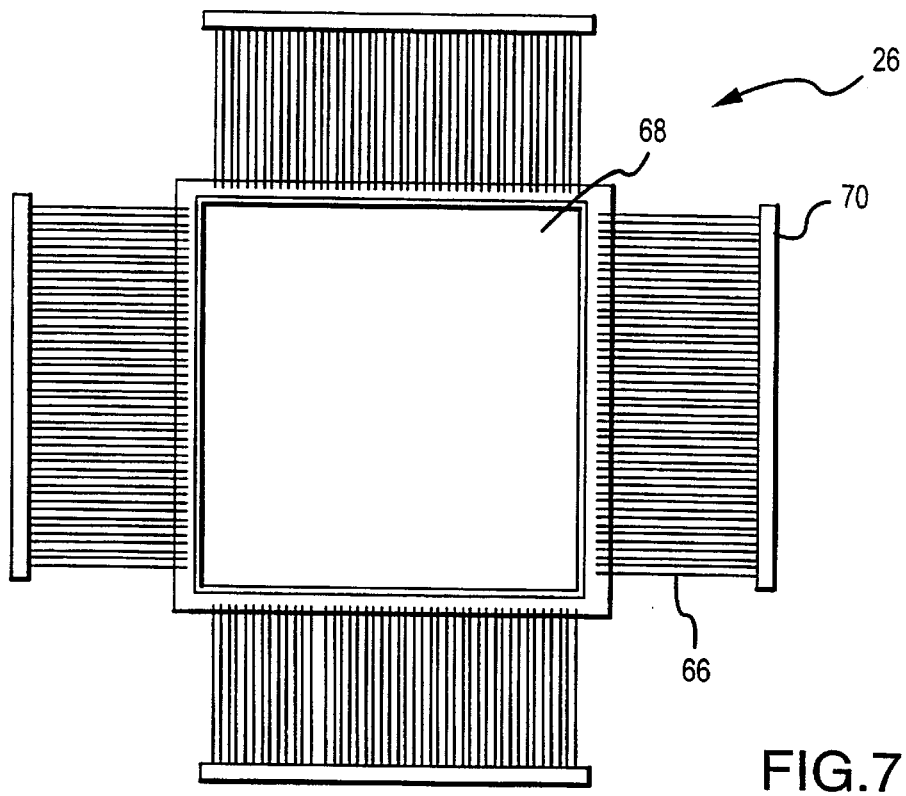
FIG. 7 is a plan view of a multi-chip module.

FIG. 7 illustrates a typical MCM 26 with a housing or cover 66 for protecting the substrate 58 and associated dies. Further illustrated in FIG. 7 are the portions of the traces 66 that extend beyond the substrate 58 of the MCM 26. Initially, the ends of the traces 66 that extend beyond the edge of the substrate 58 are joined together with a bar structure 70 that primarily serves to protect the MCM 26 prior to incorporation into the MFS 20. As such, the bar 70 is removed prior to connection of the traces 66 to a connector 28.

Figure 8A:
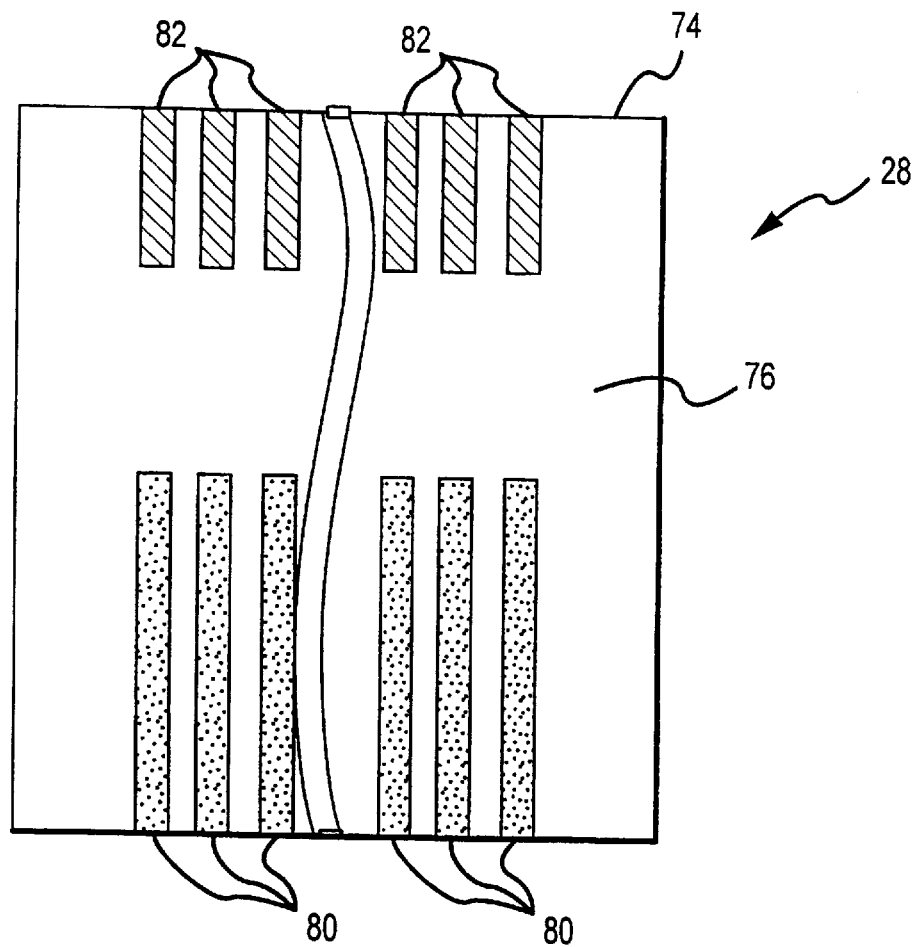
FIGS. 8A and 8B are, respectively, top and front view of one type of connector for establishing an electrical connection between a multi-chip module and a flex circuit patch in a multifunctional structure.
Figure 8B:
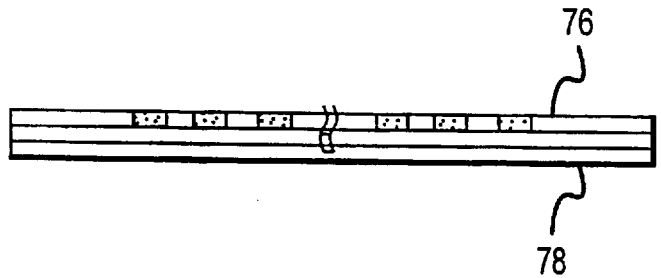

The connector 28 must generally provide an electrical connection between the multi-chip module 26 and the traces of the flex circuit patch 24. Preferably, the connector 28 also provides the ability to engage and disengage the traces associated with the multichip module 26 so that if needed, the multi-chip module 26 can be removed from the MFS 20. FIGS. 8A and 8B illustrate one type of connector 28 that satisfies this requirement. Generally, the connector 28 includes a housing 74 with a top side 76 and bottom side 78. The bottom side 78 of the housing 74 is typically attached to the top side of a flex circuit patch 24. Alternatively, the housing 74 can be attached to the top side of the panel 22. Located within the housing 74 are a plurality of well 80 that each engage one of the traces 66 from a multi-chip module 26 and are capable of disengaging from the traces if needed. Each of the wells 80 interface with a brazing pad 82 that is brazed to one of the traces on the flex circuit patch 24. A further example of a connector 26 that is capable or engaging and disengaging from the traces 66 associated with a MCM 26 is discussed in PCT Publication No. WO 98/29923, which is incorporated herein by reference.

Figure 9A:
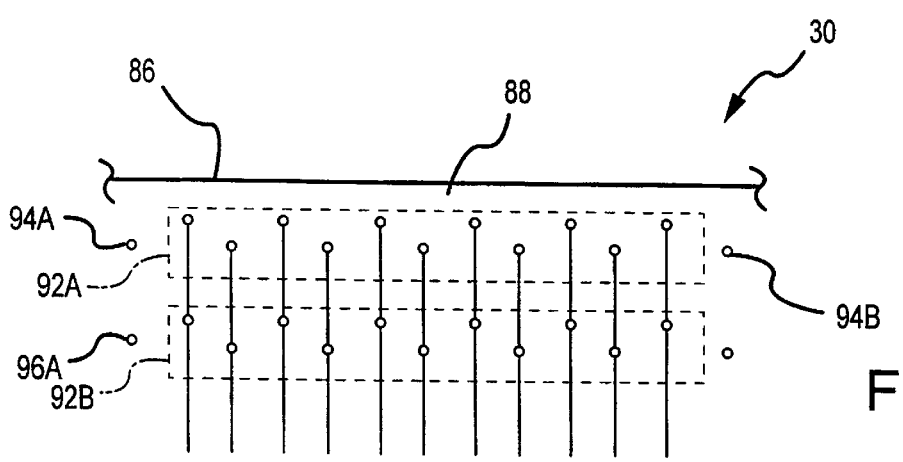
FIGS. 9A and 9B respectively illustrate structural features associated with the end of a flex circuit jumper and the joining of a flex circuit jumper to a flex circuit patch.
Figure 9B:
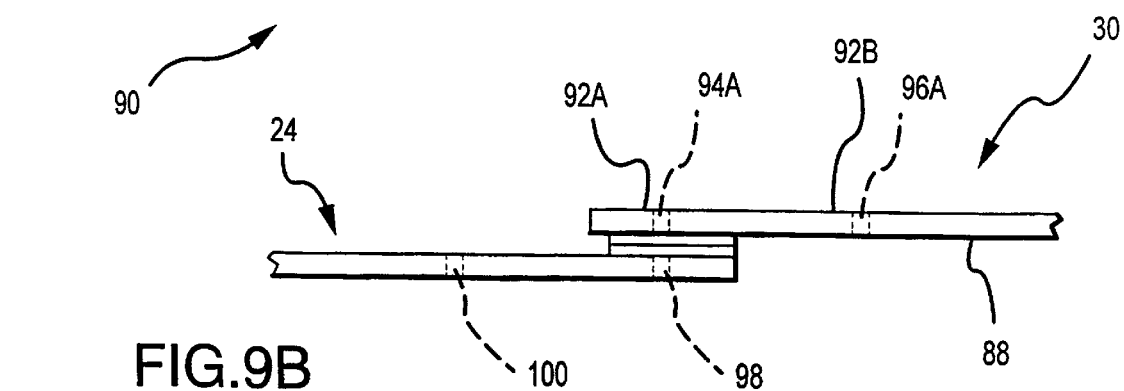

The flex circuit jumper 30 is used in the MFS 20 to establish connections between the flex circuit patch 24 and other electrical/electronic componentry. The other electrical/electronic componentry another patch located on the same panel, another patch located on a different panel, or an interface that is capable of mating the flex circuit jumper 30 with another type of signal carrier, such as a conventional cable. With reference to FIG. 9A, the flex circuit jumper 30 includes an end 86 with a bottom side 88. Located on the bottom side 88 are a plurality of traces 90. Each of the traces 90 is associated with a first pad 92A and a second pad 92B that each serve to define an area over which a bond between the flex circuit jumper 30 and the flex circuit patch 24 will be established. Associated with the first pad 92A are a pair of alignment holes 94A, 94B. Likewise, alignment holes 96A, 96B are associated with the second pad 92B. The flex circuit patch 24 has corresponding holes 98. It should be appreciated that other orientation structures are feasible, like reference marks and notches. With reference to FIG. 9B, an electrical connection between a flex circuit jumper 30 and flex circuit patch 24 is established by applying an anisotropic adhesive in the area defined by the first pad 92A, aligning the traces 90 of the flex circuit jumper 30 with the traces of the flex circuit patch 24 using the alignment holes 94A, 94B of the flex circuit jumper 30 and the corresponding alignment holes 98 of the flex circuit patch, and then curing the adhesive to establish the bond. The anisotropic adhesive provides electrical conductivity in one direction only. To elaborate, if the flex circuit patch 24 and the flex circuit jumper 30 are consider to lie in the x-y plane, the adhesive only conducts electricity in the z-direction, i.e., between the traces that are aligned with one another. Consequently, the adhesive can be applied across the entire area defined by the first pad 92A with little concern that a signal from a trace will be undesirably laterally propagated. This adhesive can also be used to establish the electrical connections between two or more the Cu/PI layers noted with respect to the flex circuit patch 24 to realize a multi-layer, flex circuit patch.

If the bond between the flex circuit jumper 30 and the flex circuit patch 24 shown in FIG. 9A must be broken to, for example, remove a defective MCM 26, the flex circuit patch 24 and the flex circuit jumper 30 are cut, i.e. cuts are made on both sides of the first pad 92A so that the bonded area can be removed. To reconnect the flex circuit jumper to the flex circuit patch 24, the process described above is repeated but the bond is established in the area defined by the second pad 92B. In this regard, the flex circuit patch 24 has a second pair of alignment holes 100.

Figure 10A:
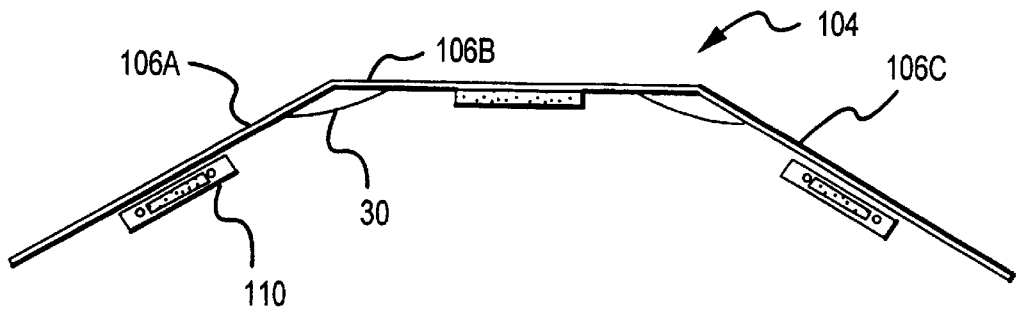
FIGS. 10A and 10B are, respectively, top and front view of a structure formed from three multifunctional structures.
Figure 10B:
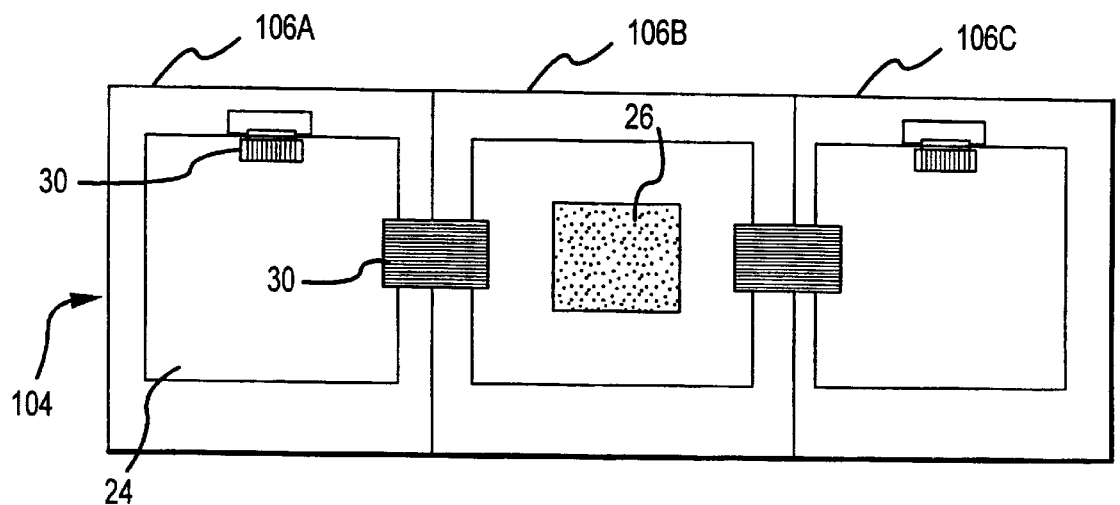
Figure 10C:
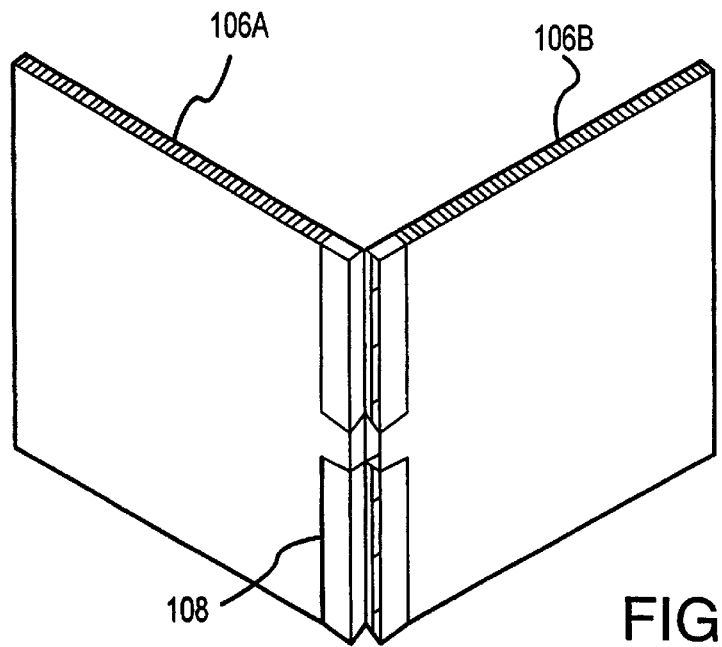
FIG. 10C illustrates a hinge-like structure that is used to connect the multifunctional structures shown in FIGS. 10A and 10B to one another.

FIGS. 10A and 10B are top and front views of a structure 104 composed of three MFS 106A–106C. The MFS 106A–106C are both physically connected together and electrically connected together. With reference to FIG. 10C, the physical connection between MFS 106A and MFS 106B is established with a hinge-like device 108 that permits the structure 104 to accommodate curved structures, such as the curved interior surface or a spacecraft. Alteratively, rigid brackets can be used to connect one MFS to another MFS. Electrical connections are established between the MFS 106A and MFS 106B using a flex circuit jumper 30. Preferably, the flex circuit jumper 30 is of sufficient length to permit different angular relationships between the MFS 106A and 106B to be attained. A flex circuit jumper is also used to establish an electrical connection between MFS 106B and MFS 106C. Another flex circuit jumper 30 is used to establish an electrical connection between the flex circuit patch 24 associated with the MFS 106A and a connector body 110 that interfaces with some other type of electrical/electronic circuitry, such as a conventional cable.

The MFS 20 provides the ability to rework or repair damaged MCMs or flex circuit patches. To elaborate, if it is necessary to remove the MCM 26 from the MFS 20, the bond 72 between the MCM 26 and the panel 22 (established with a thermally conductive and preferably shock absorbing adhesive) must be broken and the traces 66 of the MCM 26 disengaged from the connector. Breaking the bond between the MCM 26 and the panel 22 is accomplished by applying an appropriate attenuating agent to the bond, typically heat or a solvent, to weaken the bond so that the MCM 26 can be disengaged from the panel 22. Disengagement of the traces 66 from the connector 26 is dependent upon the type of connector 26 utilized.

If the flex circuit patch 24 must be removed from the MCM is removed as described above and then an attenuating agent, like heat or a solvent, is applied to weaken the bond between the flex circuit patch 24 and the panel 22. The flex circuit patch 24 is then peeled away form the panel 22.

The cover 32 can take several different forms. For instance, the cover 32 can be made of a rigid material (e.g., plastic, metal, composite etc.) to protect the underlying electrical/electronic componentry from contact by solid objects that could damage the componentry. Alternatively, the cover 32 can be made from a flexible material in applications in which contact by solid objects is less of concern but damaging contact by, for example, a liquid is a possibility. To provide protection from ionizing radiation, the cover can be from or incorporate a heavy metal, such as tantalum. To provide protection from EMI, the cover 32 can be made from a metal that, in combination with the aluminum foil sheet 40B and metal disposed on the sides of the panel 22 form a Faraday cage.

Figure 11A:
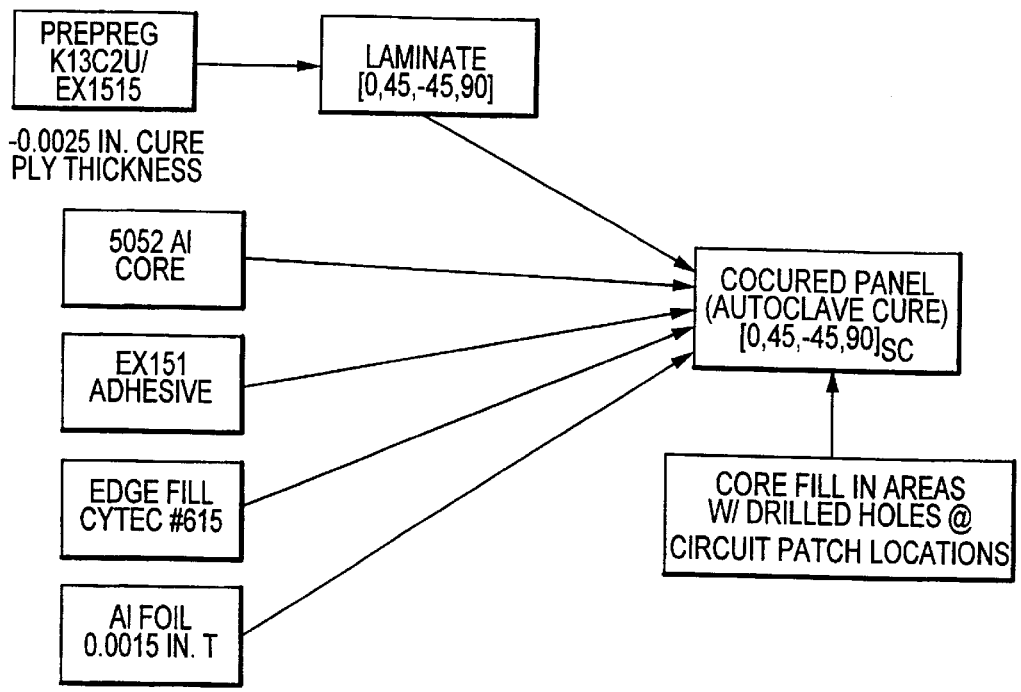
FIGS. 11A and 11B illustrate, respectively, the process steps for making the panel shown in FIG. 3 and for attaching the flex circuit patch, connector and MCM to the panel.
Figure 11B:
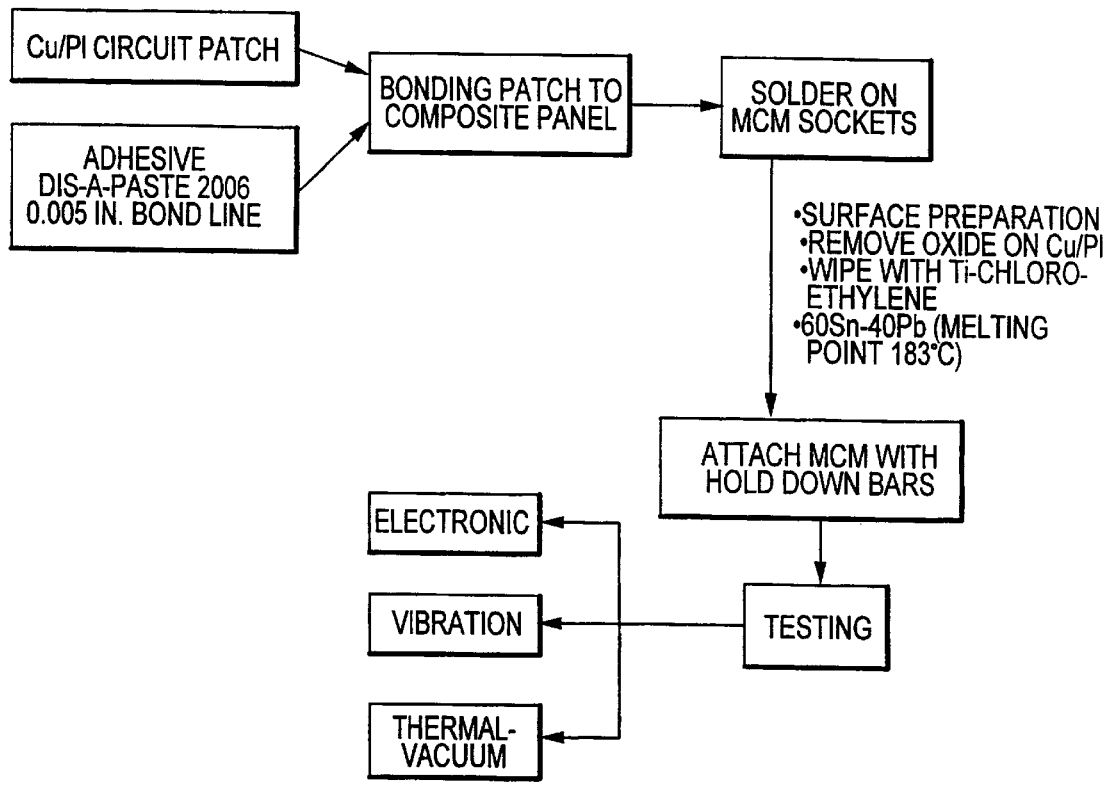

FIG. 11A illustrates the process steps for producing a particular embodiment of the type of panel 22 illustrated in FIG. 3. While particular types of material are identified in FIG. 11A it should be appreciated that many different types of materials can be used to produce such a panel, depending upon the application. FIG. 11B illustrate the process steps for attaching the flex circuit patch 24, MCM 26 and connector 28 to a panel 22. Again, even though particular material are identified in the figure, the constraints of a particular application may dictate the use other materials.

It should also be noted that, while the invention has been described with respect to the use thereof in a craft that is designed to travel in outer space, the invention is applicable to all sorts of spacecrafts. For instance, the invention can be used in land vehicles, like tanks, and armored personnel carriers. Sea-based vehicles in which the invention can be implemented include submarines and surface vessels, particular war vessels. The invention can also be implemented in aircraft and, most particularly, in large commercial and military aircraft.

The foregoing description of the invention has been presented for purposes of illustration and description. Further, the description is not intended to limit the invention to the form disclosed herein. Consequently, variations and modifications commensurate with the above teachings, and the skill or knowledge in the relevant art are within the scope of the present invention. The preferred embodiment described hereinabove is further intended to explain the best mode known of practicing the invention and the enable others skilled in the art to utilize the invention in various embodiments and with the various modifications required by their particular applications or uses of the invention. It is intended that the appended claims be construed to include alternate embodiments to the extent permitted by the prior art.

What is claimed is:

1. A multifunctional structure for use in spacecraft comprising:

a panel having a first panel side and a second panel side that is separated from said first panel sides;

a flex circuit patch having a first patch side and a second patch side that is separated from said first patch side, said second patch side having a patch lead;

a multi-chip module (MCM) comprised of at least two, unpackaged semiconductor dies integrated onto a common substrate and having at a least one MCM lead extending over said substrate for use in establishing an electrical connection between one of said two, unpackaged semiconductor dies and said flex circuit patch; and means for establishing an electrical connection between said patch lead and said MCM lead;

wherein said first patch side of said flex circuit is operatively attached to said second panel side of said panel;

wherein said MCM and said means for establishing an electrical connection are operatively attached to said second panel side of said panel;

wherein said panel provides structural support to said flex circuit patch, MCM, and means for establishing an electrical connection;

wherein said panel provides a thermal circuit for transferring heat from said MCM to said second panel side of said panel during operation of said MCM.

2. A multifunctional structure, as claimed in claim 1, wherein said panel includes:

a core with a first core side and a second core side that is separated from said first core side;

a first facesheet that is operatively attached to said first core side; and a second facesheet that is operatively attached to said second core side.

3. A multifunctional structure, as claimed in claim 2, wherein:

said core has one of the following: a honeycomb structure and a foam structure.

4. A multifunctional structure, as claimed in claim 2, further comprising:

a first laminate that is located between said core and said first facesheet; and a second laminate that is located between said core and said second facesheet.

5. A multifunctional structure, as claimed in claim 4, wherein:

at least one of said first laminate and said second laminate are quasi-isotropic to facilitate heat transfer between said MCM and said second panel side.

6. A multifunctional structure, as claimed in claim 1, further comprising:

a filler located between said first panel side and said second panel side for establishing a path of high thermal conductivity between said MCM and said second panel side.

7. A multifunctional structure, as claimed in claim 1, wherein:
said flex circuit patch comprises an adhesiveless, copper-polyimide material.

8. A multifunctional structure, as claimed in claim 1, wherein:
said flex circuit patch includes a hole for accommodating said MCM.

9. A multifunctional structure, as claimed in claim 1, wherein:
said means for establishing includes a socket for establishing an electrical connection between said MCM lead and said patch lead.

10. A multifunctional structure, as claimed in claim 1, further comprising:
a cover located over said second panel side to provide radiation shielding.

11. A multifunctional structure, as claimed in claim 10, wherein:
said cover includes a metal for providing one of the following: EMI shielding and ionization radiation shielding.

12. A modular multifunctional structure for use in a spacecraft comprising:
a panel having a first panel side and a second panel side that is separated from said first panel side;
a flex circuit patch having a first patch side and a second patch side that is separated from said first patch side;
wherein said second patch side has a patch lead with a first patch lead end and a second patch lead end;
a multi-chip module (MCM) comprised of at least two, unpackaged semiconductor dies integrated onto a common substrate and having at least one MCM lead extending over said substrate for use in establishing an electrical connection between said MCM and said flex circuit patch;
a bond connecting said first patch side of said flex circuit patch to said second panel side of said panel;
first means for establishing a first electrical connection between said first patch lead end and said MCM lead;
second means for establishing a second electrical connection between said second patch lead end and other electrical componentry;
wherein said MCM, said first means and said second means are operatively attached to said second panel side of said panel;
wherein said panel provides structural support to said flex circuit patch, MCM, first means and second means;
wherein said panel provides a thermal circuit for transferring heat from said MCM to said first panel side of said panel during operation of said MCM.

13. A modular multifunctional structure, as claimed in claim 12, wherein:
said bond is susceptible to weakening to facilitate removal of said flex circuit patch from said panel.

14. A modular multifunctional structure, as claimed in claim 12, wherein:
said bond is susceptible to weakening upon the application of one of the following: heat and a solvent.

15. A modular multifunctional structure, as claimed in claim 12, wherein:
said first means includes a socket that is operatively attached to said second patch side of said flex circuit patch.

16. A modular multifunctional structure, as claimed in claim 12, wherein:
said first means includes a socket that permits detachment of said MCM lead.

17. A modular multifunctional structure, as claimed in claim 12, wherein:
said second means includes a flex circuit jumper having a first jumper end and a second jumper end;
third means for electrically connecting said first jumper end to said second patch lead end.

18. A modular multifunctional structure, as claimed in claim 17, wherein:
said third means includes an electrically conductive, adhesive material.

19. A modular multifunctional structure, as claimed in claim 17, wherein:
said third means includes electrically conductive, anisotropic material.

20. A modular multifunctional structure, as claimed in claim 12, wherein:
said second means includes electrically conductive line extending from a first end to a second end;
a first pad operatively connected to said line and located adjacent to said first end;
a second pad operatively connected to said line and located closer to said second end and said first end;
wherein said second electrical connection is initially established between said second patch lead end and said first pad;
wherein said line can be subsequently cut between said first pad and said second pad, and said second pad can be subsequently used to establish said second electrical connection between said second patch lead end and said line.

21. A modular multifunctional structure, as claimed in claim 12, wherein:
said second patch lead end and said second means include a device for orienting said second patch lead end to said second means.

22. A modular multifunctional structure, as claimed in claim 12, wherein:
said flex circuit patch has a hole for accommodating said MCM.

23. A modular multifunctional structure, as claimed in claim 22, further comprising:
a thermally conductive adherent for bonding said MCM to said second panel side of said panel.

24. A modular multifunctional structure, as claimed in claim 23, wherein:
said adherent is susceptible to weakening to facilitate removal of said MCM, wherein said weakening occurs upon the application of one of the following: heat and a solvent.

* * * * *

UNITED STATES PATENT AND TRADEMARK OFFICE
CERTIFICATE OF CORRECTION

PATENT NO. : 6,061,243
DATED : May 9, 2000
INVENTOR(S) : Barnett et al.

It is certified that error appears in the above-indentified patent and that said Letters Patent is hereby corrected as shown below:

Column 1, Line 7, before FIELD OF THE INVENTION insert the following paragraph:
GOVERNMENT RIGHTS
This invention was made with Government support under Contract No. F29601-94-C-0167 awarded by the U.S. Air Force. The Goverment has certain rights in the invention.

Signed and Sealed this

Third Day of April, 2001

Attest:

NICHOLAS P. GODICI

*Attesting Officer*          Acting Director of the United States Patent and Trademark Office